(12) United States Patent
Ogura et al.

(10) Patent No.: US 6,795,161 B2
(45) Date of Patent: Sep. 21, 2004

(54) EXPOSURE APPARATUS, METHOD OF MANUFACTURING SEMICONDUCTOR DEVICES AND PLANT THEREFOR

(75) Inventors: Masaya Ogura, Tokyo (JP); Eiichi Murakami, Tochigi (JP); Nobuaki Ogushi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/811,419

(22) Filed: Mar. 20, 2001

(65) Prior Publication Data

US 2001/0052967 A1 Dec. 20, 2001

(30) Foreign Application Priority Data

Mar. 24, 2000 (JP) ........................................ 2000-083942

(51) Int. Cl.⁷ .......................... G03B 27/52; G03B 27/42
(52) U.S. Cl. .............................. 355/30; 355/53; 355/55
(58) Field of Search .............................. 355/30, 53, 55, 355/67–71, 77, 52; 356/399–401; 250/548

(56) References Cited

U.S. PATENT DOCUMENTS

| | | | |
|---|---|---|---|
| 4,704,348 A | * 11/1987 | Koizumi et al. | 430/327 |
| 5,025,284 A | * 6/1991 | Komoriya et al. | 355/53 |
| 5,164,974 A | 11/1992 | Kariya et al. | 378/34 |
| 5,559,584 A | * 9/1996 | Miyaji et al. | 355/73 |
| 5,838,426 A | 11/1998 | Shinonaga et al. | 355/52 |
| 5,892,572 A | 4/1999 | Nishi | 355/67 |
| 6,133,981 A | * 10/2000 | Semba | 355/27 |
| 6,222,610 B1 | 4/2001 | Hagiwara et al. | 355/30 |
| 6,226,133 B1 | * 5/2001 | Osakabe | 359/811 |
| 6,235,438 B1 | * 5/2001 | Suzuki et al. | 430/30 |
| 6,356,338 B2 | * 3/2002 | Arakawa | 355/30 |
| 2003/0020888 A1 | 1/2003 | Tanaka et al. | 355/30 |

FOREIGN PATENT DOCUMENTS

| | | | |
|---|---|---|---|
| JP | 4-30411 | | 2/1992 |
| JP | 4-304111 | | 2/1992 |
| JP | 5-210049 | * | 8/1993 |
| JP | 6-20927 | | 1/1994 |
| JP | 7-211612 | | 8/1995 |
| JP | 10-27737 | | 1/1998 |
| JP | 10-154655 | * | 6/1998 |

* cited by examiner

Primary Examiner—Henry Hung Nguyen
(74) Attorney, Agent, or Firm—Fitzpatrick, Cella, Harper & Scinto

(57) ABSTRACT

An exposure apparatus having an illuminating optics unit for irradiating a reticle, on which a predetermined pattern has been formed, with exposing light emitted from an exposure light source, a reticle stage on which the reticle is placed, a projection optics unit for projecting the predetermined pattern of the reticle onto a substrate, and a substrate stage on which the substrate is placed. The apparatus includes at least one chamber for internally accommodating the illuminating optics unit, the reticle stage, the projection optics unit and the substrate stage, a first pressure control device for making a value of pressure inside the at least one chamber higher than a value of pressure outside the at least one chamber, and a first correction device for correcting optical characteristics of the projection optics unit, by performing at least one of (i) moving an adjustment unit for adjusting the optical characteristics of the projection optics unit and (ii) shifting a wavelength of the exposing light, in accordance with the value of the pressure inside the at least one chamber.

20 Claims, 8 Drawing Sheets

FIG. 6

URL [ http://www.maintain.co.jp/db/input.html ]

MALFUNCTION DATABASE INPUT SCREEN

DATE OF OCCURRENCE [ 2000/3/15 ]~404
MODEL [ ********** ]~401
SUBJECT MATTER [ OPERATING MALFUNCTION (ERROR AT BOOTING) ]~403
EQUIPMENT SERIAL NO. [ 465NS4580001 ]~402
DEGREE OF URGENCY [ D ]~405
CONDITION [ LED CONTENTS FLASHING AFTER POWER IS TURNED ON ]~406
COUNTERMEASURE METHOD [ POWER TURNED ON AGAIN (RED BUTTON PUSHED AT START UP) ]~407
PROGRESS REPORT [ TEMPORARY MEASURES COMPLETED ]~408

(SEND) (RESET)

410 — LINK TO DATABASE OF RESULTS
411 — SOFTWARE LIBRARY
412 — OPERATING GUIDE

EXPOSURE APPARATUS, METHOD OF MANUFACTURING SEMICONDUCTOR DEVICES AND PLANT THEREFOR

FIELD OF THE INVENTION

This invention relates to an exposure apparatus in which the exposing light used is short-wavelength ultraviolet light, especially, light emitted by a light source such as an excimer laser, a harmonic laser or a mercury lamp and having an emission spectral line that overlaps the absorption spectrum region of oxygen, to a semiconductor device manufacturing method that utilizes this exposure apparatus, and to a semiconductor device manufacturing plant in which this exposure apparatus is installed.

BACKGROUND OF THE INVENTION

In lithography for manufacturing semiconductor devices, use is made of an exposure apparatus in which the image of a predetermined pattern that has been formed on a mask or reticle (referred to generically as a reticle below) is projected onto a photosensitive plate (referred to generically as a substrate below) such as a wafer or glass plate via a projection optics unit to thereby expose the substrate to the pattern. The line width of semiconductor devices is becoming increasingly small. In order to cope with this trend, lithographic processes now generally employ methods of shortening the wavelength of the exposing light emitted from the exposing light source.

An exposure apparatus in which a KrF excimer laser having a wavelength of 248 nm is used as the exposing light source has already been developed, and at present the development of an exposure apparatus in which a short-wavelength 193-nm ArF excimer laser is used as the exposing light source is in progress. An $F_2$ excimer laser having a wavelength of 157 nm has become the focus of attention as a next-generation exposing light source.

In a conventional exposure apparatus using a mercury lamp or KrF excimer laser which emits g or i lines, the emission spectral line of the exposing light emitted from these exposing light sources does not overlap the absorption spectrum region of oxygen and therefore the problems of a decline in light utilization efficiency (transmittance), which is brought about by absorption of light by oxygen, and evolution of ozone do not occur. Accordingly, the conventional exposure apparatus basically makes it possible to perform exposure in the atmosphere.

With an exposure apparatus that uses an $F_2$ excimer laser, on the other hand, the emission spectral line of the $F_2$ excimer laser beam overlaps the absorption spectrum region of oxygen. The serious problems that result are the aforementioned decline in transmittance ascribed to absorption of light by oxygen and the evolution of ozone. For example, the transmittance of an $F_2$ excimer laser in the atmosphere is actually on the order of 0.1%/mm. It is believed that the decline in transmittance is the result not only of absorption of light by oxygen but also of the effects produced by the evolution of ozone. The production of ozone not only causes a decline in transmittance but may also contaminate the surface of optical members, which are used in the projection optical unit, owing to a chemical reaction between ozone and other substances. There is the possibility that such contamination will degrade the exposing capability of the exposure apparatus.

In an exposure apparatus that uses exposing light having an emission spectral line that overlaps the absorption spectrum region of oxygen, as in the manner of the $F_2$ excimer laser, it is known to use an inert gas such as nitrogen to fill the entire optical path of the exposing light in order to avoid the problems of a decline in transmittance and the generation of ozone. Further, the specification of Japanese Patent Application Laid-Open No. 6-20927 describes an exposure apparatus using X rays having properties similar to those of an $F_2$ excimer laser. The exposure apparatus is sealed within a chamber, the interior of the chamber is evacuated and exposure is carried out in such an environment of reduced pressure.

These conventional techniques involve a certain problem. Specifically, the arrangement is such that the entirety of the optical path of the exposing light is sealed within a chamber and the interior of the chamber is filled with inert gas, or such that the interior of the chamber is evacuated to produce an environment of reduced pressure. As a consequence, there is the possibility that the oxygen in the atmosphere outside the chamber will penetrate into the chamber from extremely small gaps.

Furthermore, in a case where the pressure within the chamber differs from atmospheric pressure, there is the possibility that the projected image will be degraded unless the optical characteristics of the projection optics unit are corrected in dependence upon the value of pressure within the chamber accommodating the projection optics.

SUMMARY OF THE INVENTION

The present invention has been proposed to solve the aforementioned problems of the prior art and has as its object to provide an exposure apparatus, semiconductor device manufacturing method and manufacturing plant therefor, in which exposure can be carried out under reliably oxygen-free conditions by making the pressure within the chamber higher than the pressure (atmospheric pressure) outside the chamber to prevent atmospheric oxygen outside the chamber from penetrating into the interior thereof, and in which the optimum projected image can be obtained by correcting the optical characteristics of the projection optics unit in accordance with the value of pressure within the chamber.

According to the present invention, the foregoing object is attained by providing an exposure apparatus and semiconductor device manufacturing method having the characterizing features described below.

Specifically, the present invention provides an exposure apparatus having an illuminating optics unit for irradiating a reticle, on which a predetermined pattern has been formed, with exposing light emitted from an exposing light source, a reticle stage on which the reticle is placed, a projection optics unit for projecting the predetermined pattern of the reticle onto a substrate, and a substrate stage on which the substrate is placed, the apparatus comprising at least one chamber for internally accommodating the illuminating optics unit, the reticle stage, the projection optics unit and the substrate stage; first pressure control means for making pressure inside the chamber higher than pressure outside the chamber; and first correction means for correcting optical characteristics of the projection optics unit in accordance with a value of pressure inside the chamber.

In a preferred embodiment of the present invention, the reticle is irradiated with exposing light, which has been emitted by the exposing light source, via the illuminating optics unit, the predetermined pattern that has been formed on the reticle is projected onto the substrate via the projection optics unit to expose the substrate to the pattern, and the exposing light has an optical path the entirety of which is sealed within at least one chamber, the apparatus further comprising second pressure control means for making pressure inside this chamber higher than pressure outside this chamber, and second correction means for correcting optical characteristics of the projection optics unit in accordance with a value of pressure inside this chamber.

The present invention further provides a method of manufacturing a semiconductor device, the method comprising the steps of: placing a group of manufacturing equipment for performing various processes, inclusive of the above-described exposure apparatus, in a plant for manufacturing semiconductor devices; and manufacturing a semiconductor device by a plurality of processes using this group of manufacturing equipment.

The present invention further provides a plant for manufacturing a semiconductor device, comprising: a group of manufacturing equipment for performing various processes, inclusive of the above-described exposure apparatus; a local-area network for interconnecting the group of manufacturing equipment, and a gateway for making it possible to access, from the local-area network, an external network outside the plant, whereby information relating to at least one of the pieces of manufacturing equipment can be communicated by data communication.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a diagram useful in describing a display screen on manufacturing equipment;

DESCRIPTION OF THE PREFERRED EMBODIMENT

A preferred embodiment of the present invention will now be described in detail in accordance with the accompanying drawings.

Figure 1:
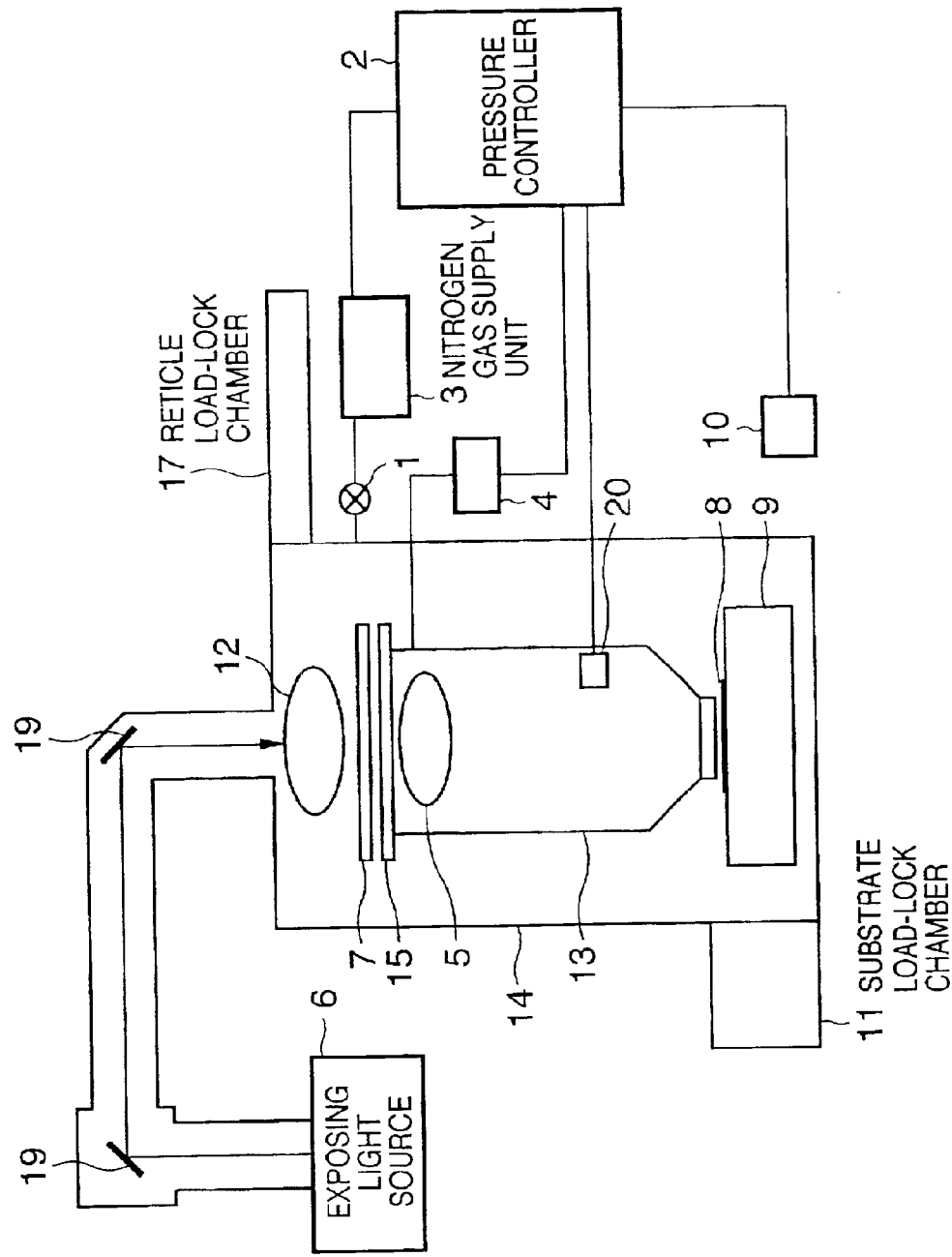
FIG. 1 is a diagram useful in describing the structure of an exposure apparatus according to the present invention.

FIG. 1 is a diagram useful in describing the structure of an exposure apparatus according to the present invention.

As shown in FIG. 1, the exposure apparatus has an exposing light source 6, for emitting short-wavelength light, such as an $F_2$ excimer laser. Light emitted from the exposing light source 6 is reflected by a mirror 19 and uniformly irradiates a reticle 7, which has been placed on a reticle stage 15, via an illumninating optical member 12.

The optical path from the exposing light source 6 to the reticle 7 is constituted by an illuminating optics unit. Light that has passed through the reticle 7 reaches a substrate 8, which has been placed on a substrate stage 9, via various optical members constructing a projection optics unit 13, whereby the image of a predetermined pattern on the reticle 7 is formed on the substrate 8.

The illuminating optics unit, reticle stage 15, projection optics unit 13 and substrate stage 9 are accommodated within a chamber 14. At such time, the interior of the chamber 14 is filled nitrogen gas, which is one of the inert gases, and the interior of the chamber 14 is held at a value of a pressure higher than that of the pressure outside the chamber. The atmosphere within the chamber 14 is controlled by a pressure controller 2, nitrogen gas supply unit 3 and pump 1.

The pressure controller 2 corrects the optical characteristics of the projection optics unit 13 by sensing the value of pressure inside the chamber 14 using a pressure sensor 20, and driving an adjustment unit 5, which is provided within the projection optics unit 13, via a correction control unit 4 that estimates the amount of change in optical characteristics of the projection optics unit 13 based upon the refractive index, which varies in accordance with the pressure value. Further, the pressure controller 2 senses the value of pressure inside the chamber 14 using a pressure sensor 10 and regulates the pressure inside the chamber to a predetermined pressure value based upon the value of pressure sensed.

The substrate 8 is carried in to be exposed and is carried out following exposure via a substrate load-lock chamber 11. As a result, when the substrate 8 is carried in and out, the exposure process need not be interrupted and, hence, there is no decline in throughput. In addition, the atmosphere within the chamber 14 is not disrupted.

The reticle 7 is exchanged for another via a reticle load-lock chamber 7. This, too, means that there is no decline in throughput and no disruption of the atmosphere within the chamber 14.

Two methods of controlling the pressure inside the chamber 14 will now be described.

Figure 2:
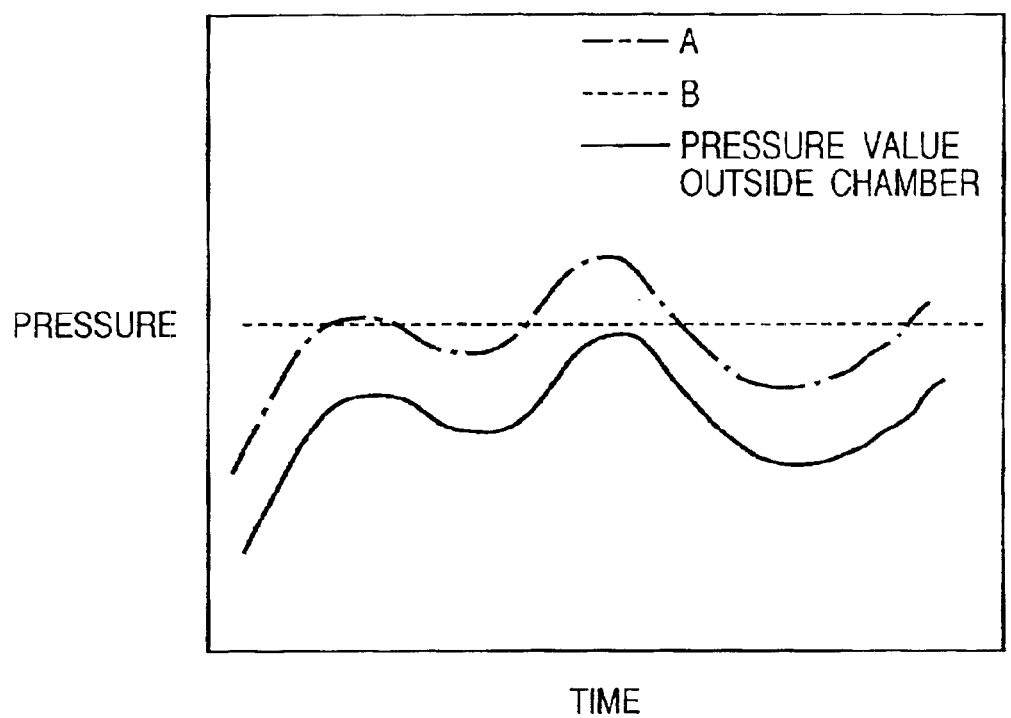
FIG. 2 is a graph useful in describing control of pressure inside a chamber.

The first method exercises control in such a manner that the value of pressure inside the chamber 14 is made higher, by a certain, fixed amount (as indicated by the dot-and-dash line A in FIG. 2), than the value of pressure outside the chamber 14, which varies as indicated by the solid line in FIG. 2. With this method, the pressure inside the chamber 14 is varied from moment to moment with the change in pressure outside the chamber 14. In order to achieve this, the optical characteristics of the projection optics unit 13 must be corrected frequently in conformity with the variation in pressure.

The second method exercises control in such a manner that the value of pressure inside the chamber 14 is regulated to a fixed value (indicated by the dashed line B in FIG. 2) higher than the peak value of pressure outside the chamber 14, which varies as indicated by the solid line in FIG. 2. With this method, the value of the pressure inside the chamber 14 is kept constant and, therefore, it is unnecessary to frequently correct the optical characteristics of the projection optics unit 13.

Figure 3:
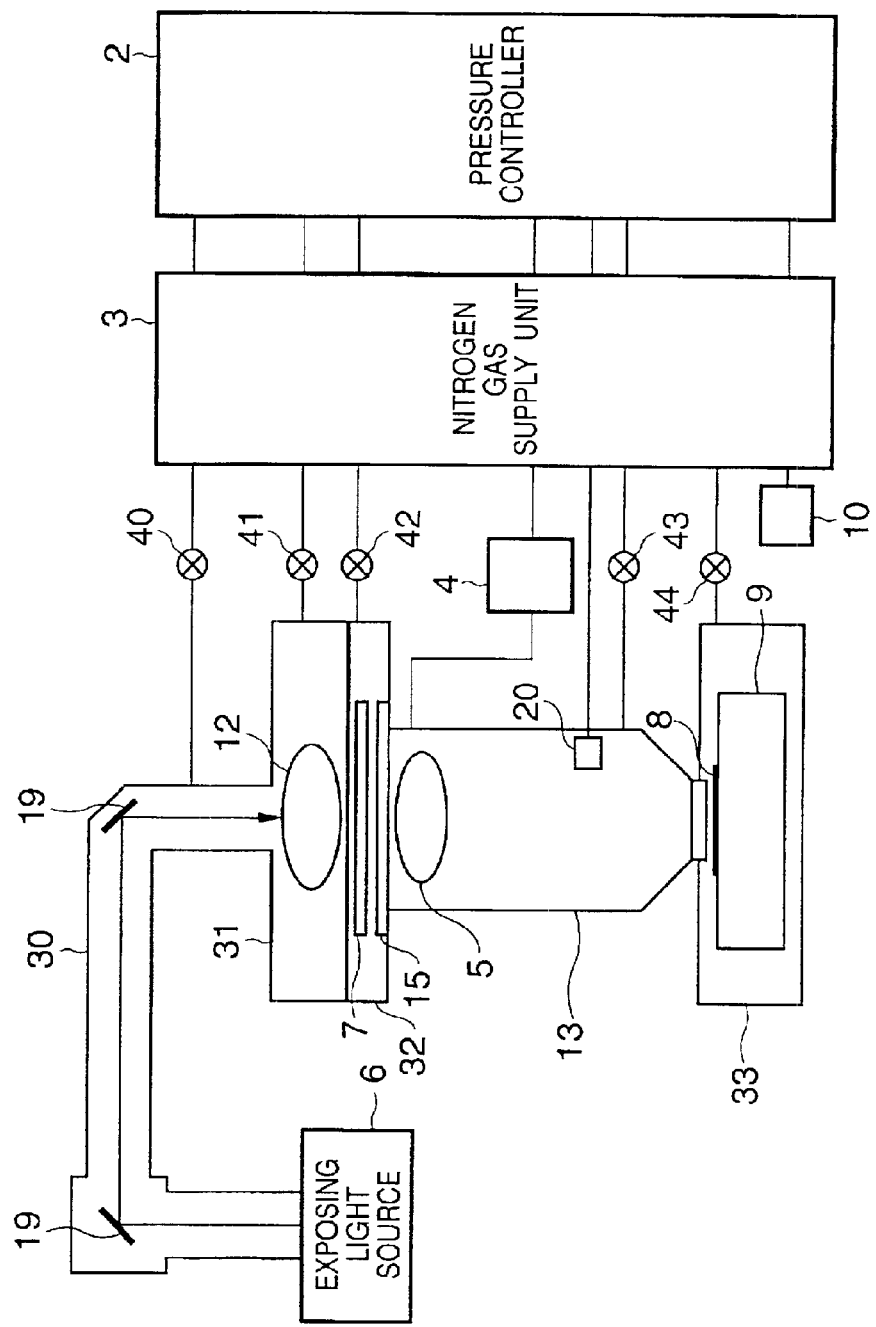
FIG. 3 is a diagram illustrating an arrangement in which a chamber is provided for each unit in an exposure apparatus according to the present invention.

In the embodiment described above, the illuminating optical unit, the reticle stage 15, the projection optics unit 13 and the substrate stage 9 are all accommodated within the chamber 14. However, as shown in FIG. 3, an arrangement may be adopted in which separate chambers 30, 31, 32, 13 and 33 and pumps 40, 41, 42, 43 and 44 are provided for each of these units, and the atmospheres within the respective chambers 30, 31, 32, 13 and 33 are controlled. Though the arrangement in FIG. 3 is such that the nitrogen gas supply unit 3 is used jointly by each of the above-mentioned units, these may be provided as separate units and controlled as such in the same manner as the chambers. Furthermore, rather than providing a separate chamber for each unit, a chamber may be provided and controlled for every two or more units.

In the embodiment described above, nitrogen gas is employed as the inert gas. However, a different inert gas can be used as long as the absorption spectrum region does not overlap the emission spectral line of the exposing light. For example, it is permissible to use helium gas or a mixture of nitrogen gas and helium gas.

Further, in the embodiment described above, the optical characteristic of the projection optics unit 13 is corrected by driving the adjustment unit 5 in accordance with the value of pressure inside the chamber 14. However, it may be so arranged that the correction is performed by shifting the wavelength of the exposing light on the side of the exposing light source 6.

Though the present invention relates to an exposure apparatus using an exposing light source that emits short-wavelength light such as the light from an $F_2$ excimer laser, it should be obvious that the invention can be applied effectively also to a photoresist of the type that cannot be used in an oxygen atmosphere and to a substrate coated with a such a photoresist. Furthermore, it goes without saying that the projection optics unit 13 can be applied effectively to any of a reflecting unit, reflecting-refraction unit and refraction unit.

<Embodiment of System for Manufacturing Semiconductor Devices>

A system for manufacturing semiconductor devices (semiconductor chips such as ICs and LSI chips, liquid crystal panels, CCDs, thin-film magnetic heads and micromachines, etc.) will now be described. This system utilizes a computer network located outside the manufacturing plant to deal with troubleshooting and regular maintenance of manufacturing units installed in the plant or to provide maintenance services such as the provision of software.

Figure 4:
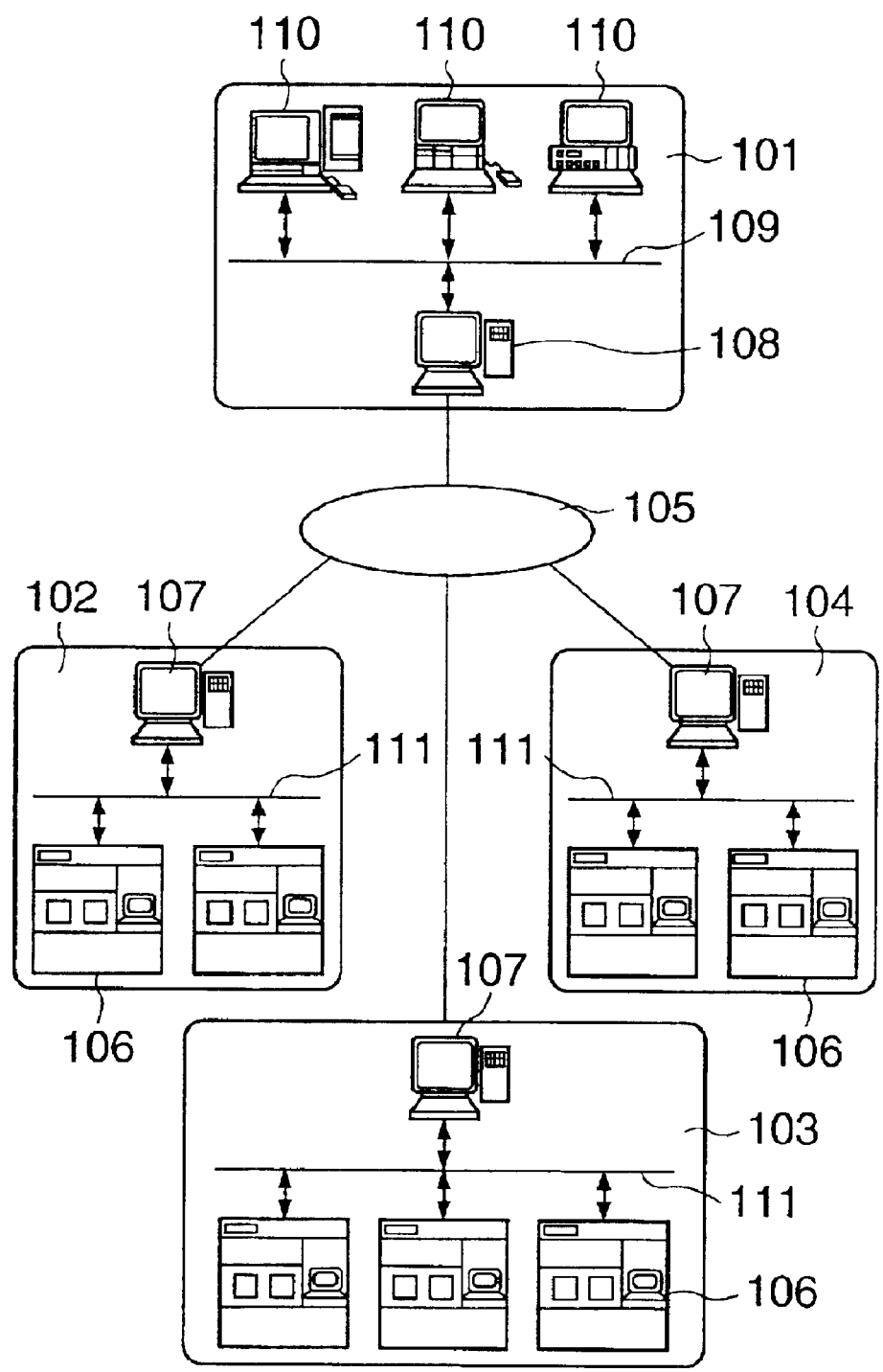
FIG. 4 is a diagram illustrating a system for manufacturing semiconductor devices.

FIG. 4 illustrates a group of manufacturing equipment connected to a network. These pieces of equipment, which are part of the overall system, are expressed according to one aspect of the embodiment. Numeral 101 in FIG. 4 denotes the place of business of a vender (the equipment supplier), which supplies the equipment for manufacturing semiconductor devices. An actual example of the manufacturing equipment is semiconductor manufacturing equipment for various processes used at a semiconductor plant, e.g., pre-treatment equipment (lithographic equipment such as exposure equipment, resist treatment equipment and etching equipment, heat treatment equipment, thin-film equipment and smoothing equipment, etc.). The business location 101 includes a host management system 108 for providing a manufacturing-equipment maintenance database, a plurality of control terminal computers 110, and a local-area network (LAN) 109 for connecting these components into an intranet. The host management system 108 has a gateway for connecting the LAN 109 to the Internet 105, which is a network external to the business location 101, and a security function for limiting access from the outside.

Numerals 102 to 104 denote manufacturing plants of semiconductor makers which are the users of the manufacturing equipment. The manufacturing plants 102 to 104 may be plants belonging to makers that differ from one another or plants belonging to the same maker (e.g., pre-treatment plants and post-treatment plants, etc.). Each of the plants 102 to 104 is provided with a plurality of pieces of manufacturing equipment 106, a local-area network (LAN) 111 which connects these pieces of equipment to construct an intranet, and a host management system 107 serving as a monitoring unit for monitoring the status of operation of each piece of manufacturing equipment 106. The host management system 107 provided at each of the plants 102 to 104 has a gateway for connecting the LAN in each plant to the Internet 105 serving as the external network of the plants. As a result, it is possible for the LAN of each plant to access the host management system 108 on the side of the vendor 101 via the Internet 105. By virtue of the security function of the host management system 108, users allowed to access the host management system 108 are limited.

According to this system, status information (e.g., the condition of manufacturing equipment that has malfunctioned), which indicates the status of operation of each piece of manufacturing equipment 106, can be reported from the plant side to the vendor side. In addition, information in response to such notification (e.g., information specifying how to troubleshoot the problem, troubleshooting software and data, etc.), as well as the latest software and maintenance information such as help information, can be acquired from the vendor side. A communication protocol (TCP/IP), which is used generally over the Internet, can be employed for data communication between the plants 102 104 and the vendor 101 and for data communication over the LAN 111 within each plant. Instead of utilizing the Internet as the external network of a plant, it is also possible to utilize a highly secure leased-line network (ISDN, etc.) that cannot be accessed by a third party. Further, the host management system is not limited to that provided by a vendor, for an arrangement may be adopted in which the user constructs a database, places it on an external network and allows the database to be accessed from a number of plants that belong to the user.

Figure 5:
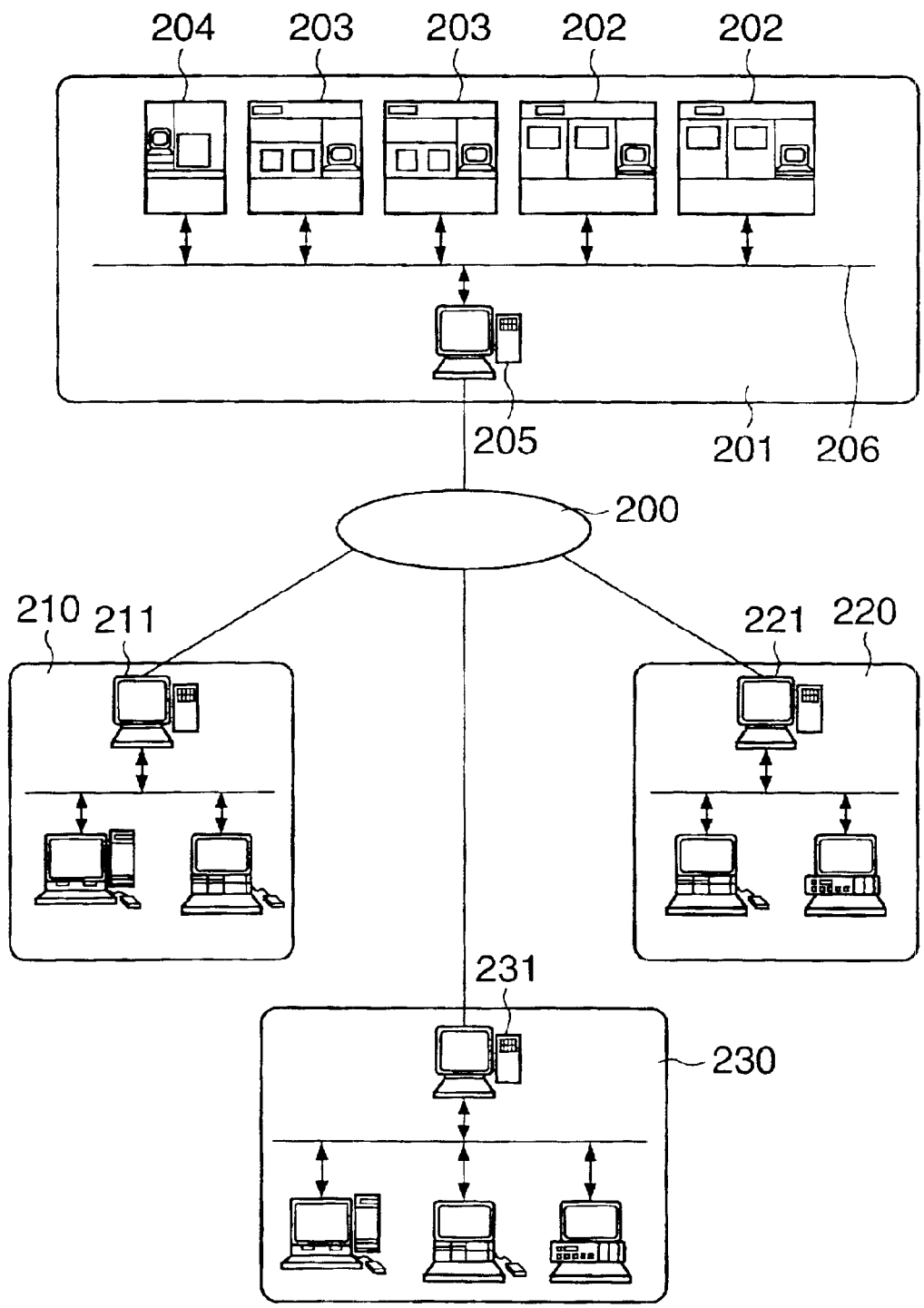
FIG. 5 is a diagram illustrating a system for manufacturing semiconductor devices as seen from another viewpoint.

FIG. 5 is a conceptual view illustrating the overall system of this embodiment expressed according to an aspect different from that depicted in FIG. 4. In the earlier example, a plurality of user plants each having manufacturing equipment are connected by an external network to the management system of the vendor that provided the manufacturing equipment, and information concerning the production management of each plant and information concerning at least one piece of manufacturing equipment is communicated by data communication via the external network. In the example of FIG. 5, on the other hand, a plant having manufacturing equipment provided by a plurality of vendors is connected by an outside network to management systems of respective ones of the vendors of these plurality of pieces of manufacturing equipment, and maintenance information for each piece of manufacturing equipment is communicated by data communication. This system includes a manufacturing plant 201 of the user manufacturing equipment (the maker of semiconductor devices). The manufacturing line of this plant includes manufacturing equipment for implementing a variety of processes. Examples of such equipment are exposure equipment 202, resist treatment equipment 203 and thin-film treatment equipment 204. Though only one manufacturing plant 201 is shown in FIG. 5, in actuality a plurality of these plants is networked in the same manner.

The pieces of equipment in the plant are interconnected by a LAN 206 to construct an intranet and the operation of the manufacturing line is managed by a host management system 205. The places of business of vendors (equipment suppliers) such as an exposure equipment maker 210, resist treatment equipment maker 220 and thin-film treatment equipment maker 230 have host management systems 211, 221, 231, respectively, for remote maintenance of the equipment they have supplied. These have maintenance databases and gateways to the outside network, as described earlier. The host management 205 for managing each piece of equipment in the manufacturing plant of the user is connected to the management systems 211, 221, 231 of the vendors of these pieces of equipment by the Internet or leased-line network serving as an external network 200. If any of the series of equipment in the manufacturing line malfunctions, the line ceases operating. However, this can be dealt with rapidly by receiving remote maintenance from the vendor of the faulty equipment via the Internet 200, thereby making it possible to minimize line downtime.

Each piece of manufacturing equipment installed in the semiconductor manufacturing plant has a display, a network interface and a computer for executing network-access software and equipment operating software stored in a storage device. The storage device can be an internal memory or hard disk or a network file server. The software for network access includes a special-purpose or general-purpose Web browser and presents a user interface, which has a screen of the kind shown by way of example in FIG. 6, on the display. The operator managing the manufacturing equipment at each plant enters information at the input items on the screen while observing the screen. The information includes the model (401) of the manufacturing equipment, its serial number (402), the subject matter (403) of the problem, its date of occurrence (404), degree of urgency (405), the particular condition (406), countermeasure method (407) and progress report (408). The entered information is transmitted to the maintenance database via the Internet. The appropriate maintenance information is sent back from the maintenance database and is presented on the display screen. The user interface provided by the Web browser implements hyperlink functions (410 to 412) as illustrated and enables the operator to access more detailed information for each item, to extract the latest version of software, which is used for the manufacturing equipment, from a software library provided by the vender, and to acquire an operating guide (help information) for reference by the plant operator.

A process for manufacturing a semiconductor device utilizing the production system set forth above will now be described.

Figure 7:
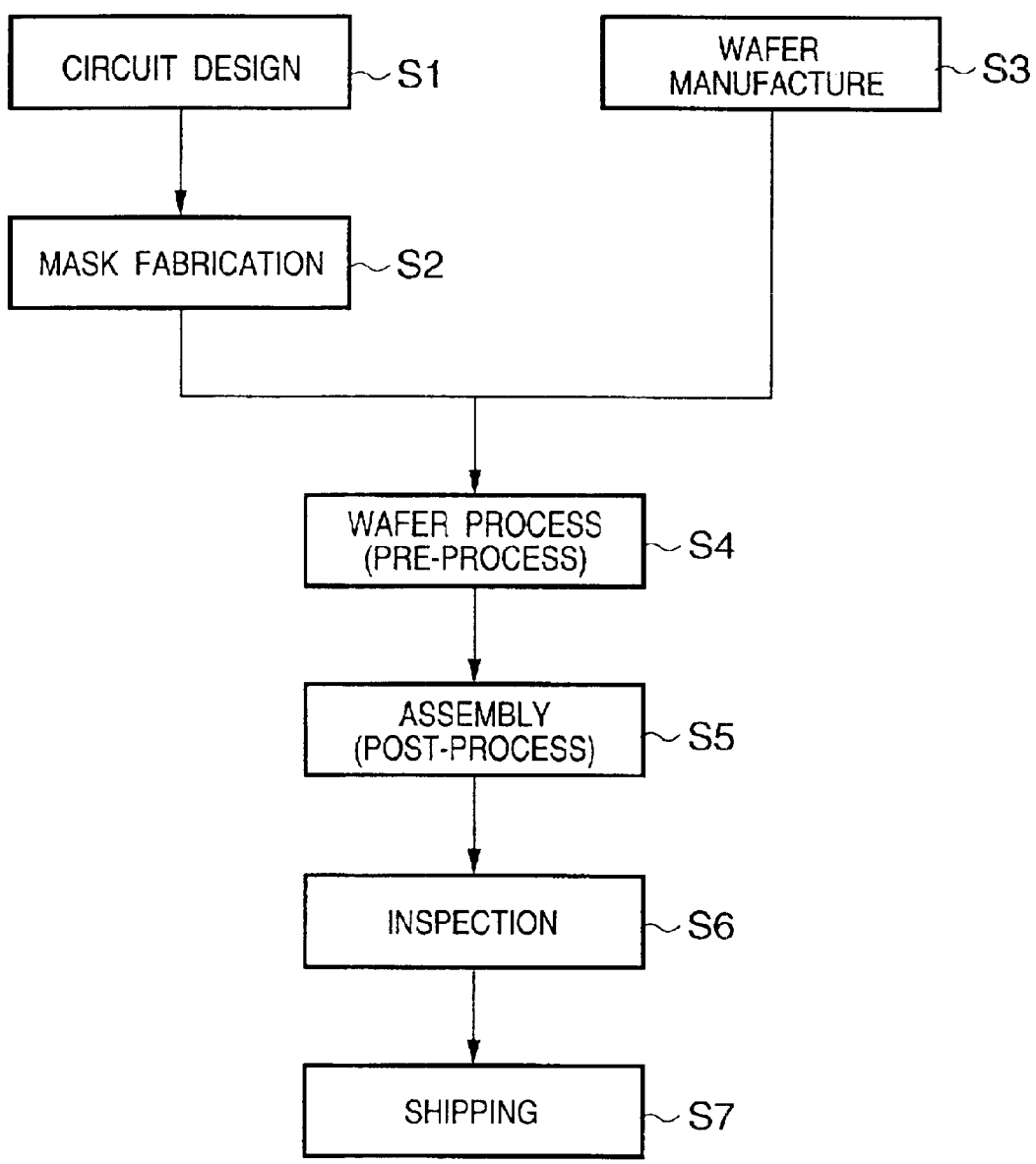
FIG. 7 is a diagram useful in describing the flow of a process for manufacturing semiconductor devices.

FIG. 7 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7). The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or leased-line network.

Figure 8:
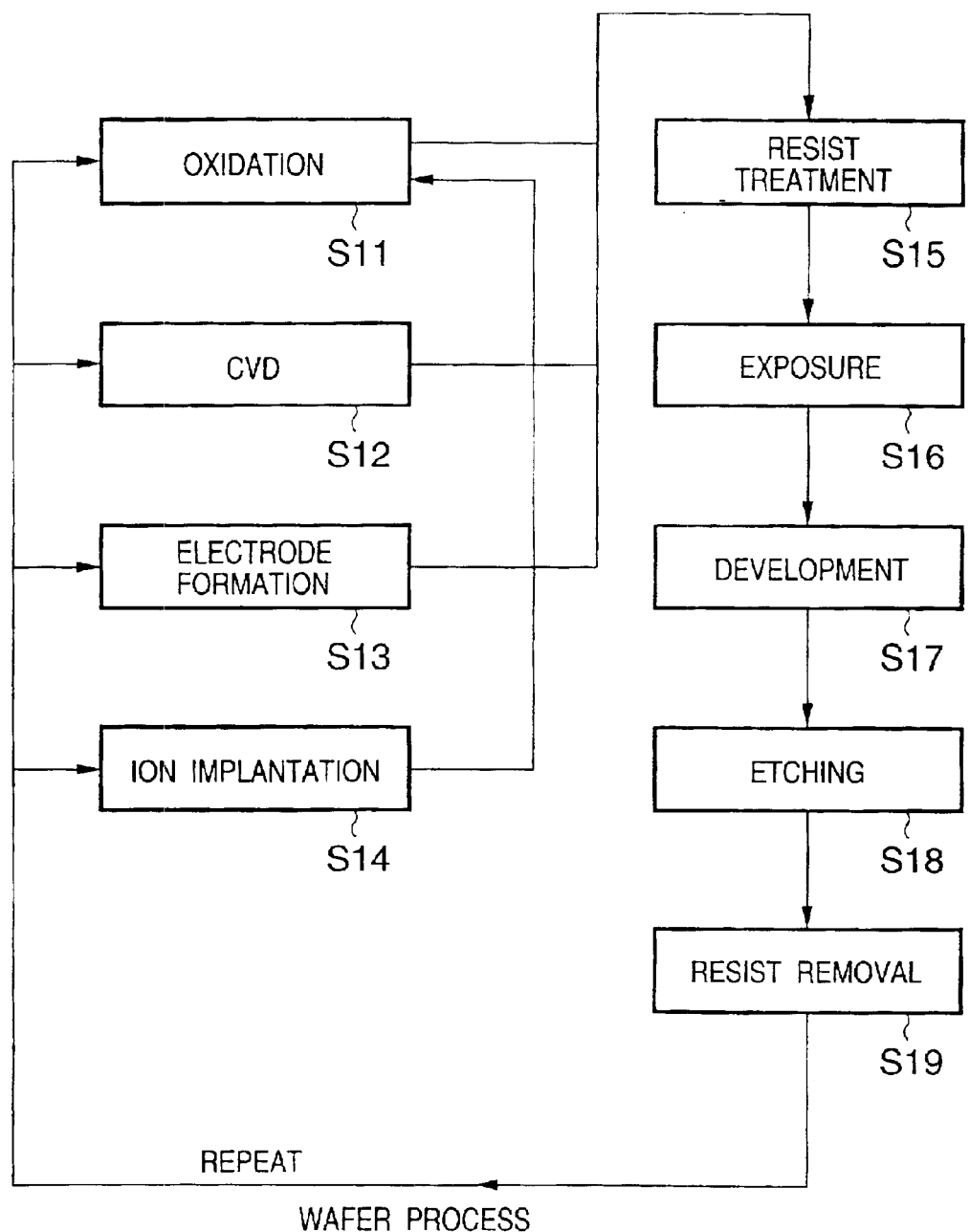
FIG. 8 is a diagram useful in describing the detailed flow of a wafer process.

FIG. 8 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

Thus, as described above, the present invention is such that in an exposure apparatus using exposing light having a light-emission spectral line that overlaps the absorption spectrum region of oxygen, the overall optical path of the exposing light is sealed inside a chamber and pressure inside the chamber is made higher than the pressure outside the chamber. As a result, atmospheric oxygen outside the chamber can be prevented from penetrating the interior of the chamber, thereby making it possible to perform exposure more reliably under oxygen-free conditions. Furthermore, the best projected image can be obtained by correcting the optical characteristics of the projection optics unit in accordance with the value of pressure inside the chamber.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus having an illuminating optics unit for irradiating a reticle, on which a predetermined pattern has been formed, with exposing light emitted from an exposure light source, a reticle stage on which the reticle is placed, a projection optics unit for projecting the predetermined pattern of the reticle onto a substrate, and a substrate stage on which the substrate is placed, said apparatus comprising:

at least one chamber for internally accommodating the illuminating optics unit, the reticle stage, the projection optics unit and the substrate stage;

first pressure control means for making a value of pressure inside said at least one chamber higher than a value of pressure outside said at least one chamber; and first correction means for correcting optical characteristics of the projection optics unit, by performing at least one of (i) moving an adjustment unit while controlling the value of pressure inside said at least one chamber based on the value controlled by said first pressure control means, for adjusting the optical characteristics of the projection optics unit and (ii) shifting a wavelength of the exposing light while controlling the value of pressure inside said at least one chamber, in accordance with the value of the pressure inside said at least one chamber.

2. The apparatus according to claim 1, wherein the interior of said at least one chamber is filled with inert gas.

3. The apparatus according to claim 2, wherein the inert gas is selected from the group consisting of nitrogen gas, helium gas and a mixed gas of nitrogen gas and helium gas.

4. The apparatus according to claim 1, wherein control is performed in such a manner that the value of the pressure inside said at least one chamber is made higher, by a fixed amount, than the value of the pressure outside said at least one chamber.

5. The apparatus according to claim 1, wherein the value of the pressure inside said at least one chamber is made constant.

6. The apparatus according to claim 1, further comprising a first pressure sensor for sensing the value of the pressure inside said at least one chamber and a second pressure sensor for sensing the value of the pressure outside said at least one chamber.

7. The apparatus according to claim 1, wherein said first correction means estimates an amount of change in optical characteristics of the projection optics unit based upon an index of refraction, which varies in accordance with the value of the pressure inside said at least one chamber, and corrects the optical characteristics of the projection optics unit based upon the estimated amount of a change in the optical characteristics of the projection optics unit.

8. The apparatus according to claim 1, further comprising a substrate load-lock chamber in the vicinity of the substrate stage and a reticle load-lock chamber in the vicinity of the reticle stage.

9. The apparatus according to claim 1, wherein the illuminating optics unit, the reticle stage, the projection optics unit and the substrate stage are accommodated in respective ones of separate chambers.

10. The apparatus according to claim 1, wherein the illuminating optics unit, the reticle stage, the projection optics unit and the substrate stage are accommodated in at least two separate chambers.

11. The apparatus according to claim 1, wherein said adjusting unit includes a refraction lens.

12. An exposure apparatus comprising:

an illumination optical system for illuminating a pattern formed on a reticle with light emitted from a light source;

a projection optical system for projecting the pattern onto a substrate;

a chamber for surrounding the projection optical system, wherein a value of pressure inside of said chamber is set to be higher than a value of pressure outside of said chamber;

a pressure sensor to measure the value of pressure inside of the chamber; and adjusting means for performing at least one of (i) moving an adjusting unit disposed in the projection optical system while controlling the value of pressure inside of said chamber based on the measured value of inside pressure and (ii) shifting a wavelength of the light emitted from the light source while controlling the value of pressure inside of said chamber based on the measured value of inside pressure.

13. The apparatus according to claim 12, wherein the projection optical system is a system using reflection of the light.

14. The apparatus according to claim 13, wherein the adjusting unit includes a refraction lens.

15. The apparatus according to claim 12, wherein optical characteristics of the projection optical system are adjusted by moving the adjusting unit.

16. The apparatus according to claim 12, wherein optical characteristics of the projection optical system are adjusted by shifting the wavelength of the light.

17. A method of manufacturing a semiconductor device, comprising the steps of:

exposing a substrate by using an exposure apparatus; and developing the exposed substrate, wherein the exposure apparatus comprises:

an illumination optical system for illuminating a pattern formed on a reticle with light emitted from a light source;

a projection optical system for projecting the pattern onto a substrate;

a chamber for surrounding the projection optical system, wherein a value of pressure inside of the chamber is set to be higher than a value of pressure outside of the chamber;

a pressure sensor to measure the value of pressure inside of the chamber; and adjusting means for performing at least one of (i) moving an adjusting unit disposed in the projection optical system while controlling the value of pressure inside of said chamber based on the measured value of inside pressure and (ii) shifting a wavelength of the light emitted from the light source while controlling the value of pressure inside of said chamber based on the measured value of inside pressure.

18. The apparatus according to claim 1, wherein said first pressure control means controls the pressure inside said at least one chamber to make constant a difference between the value of pressure inside and the value of pressure outside said at least one chamber.

19. A device manufacturing method comprising:

a step of exposing a substrate by using an exposure apparatus according to claim 1; and a step of developing the exposed wafer.

20. The apparatus according to claim 12, further comprising control means for controlling the value of pressure inside of said chamber to make constant a difference between the value of pressure inside and the value of pressure outside of said chamber.

* * * * *

UNITED STATES PATENT AND TRADEMARK OFFICE
CERTIFICATE OF CORRECTION

PATENT NO. : 6,795,161 B2
DATED : September 21, 2004
INVENTOR(S) : Masaya Ogura et al.

It is certified that error appears in the above-identified patent and that said Letters Patent is hereby corrected as shown below:

Title page,
Item [56], References Cited, FOREIGN PATENT DOCUMENTS, delete the following:
"JP     4-30411        2/1992".

Column 1,
Line 55, "on" should read -- in --.

Column 2,
Line 25, "in dependence" should read -- depending --.

Column 3,
Line 57, "EMBODIMENT" should read -- EMBODIMENTS --.

Column 4,
Line 3, "illumninating" should read -- illuminating --.

Column 5,
Line 51, "vender" should read -- vendor --.

Column 6,
Line 32, "plants 102" should read -- plants 102~ --.

Column 7,
Line 46, "vender," should read -- vendor, --.

Signed and Sealed this

Twenty-fifth Day of January, 2005

JON W. DUDAS
*Director of the United States Patent and Trademark Office*